US006983215B2

(12) United States Patent
Coumou et al.

(10) Patent No.: US 6,983,215 B2
(45) Date of Patent: Jan. 3, 2006

(54) RF METROLOGY CHARACTERIZATION FOR FIELD INSTALLATION AND SERVICEABILITY FOR THE PLASMA PROCESSING INDUSTRY

(75) Inventors: David J. Coumou, Webster, NY (US); Clifford C. Weatherell, Rochester, NY (US); Michael L. Kirk, Bloomfield, NY (US); Kevin Nasman, North Chili, NY (US)

(73) Assignee: MKS Instruments, Inc., Andover, MA (US)

( * ) Notice: Subject to any disclaimer, the term of this patent is extended or adjusted under 35 U.S.C. 154(b) by 22 days.

(21) Appl. No.: 10/727,081

(22) Filed: Dec. 2, 2003

(65) Prior Publication Data

US 2005/0119864 A1 Jun. 2, 2005

(51) Int. Cl.
*G01R 35/00* (2006.01)
(52) U.S. Cl. .......................... 702/106; 702/57; 702/60; 702/64; 702/65
(58) Field of Classification Search ................. 702/57, 702/60, 64, 65, 117, 118; 333/17.3
See application file for complete search history.

(56) References Cited

U.S. PATENT DOCUMENTS

| | | | | |
|---|---|---|---|---|
| 4,679,007 A | * | 7/1987 | Reese et al. | 333/17.3 |
| 4,861,148 A | | 8/1989 | Santo et al. | 350/505 |
| 5,285,236 A | | 2/1994 | Jain | 355/53 |
| 5,402,224 A | | 3/1995 | Hirukawa et al. | 356/124 |
| 5,438,413 A | | 8/1995 | Mazor et al. | 356/363 |
| 5,472,561 A | * | 12/1995 | Williams et al. | 438/10 |
| 5,615,006 A | | 3/1997 | Hirukawa et al. | 356/124 |
| 5,737,496 A | * | 4/1998 | Frye et al. | 706/23 |
| 5,757,507 A | | 5/1998 | Ausschnitt et al. | 356/401 |
| 5,834,931 A | | 11/1998 | Moore et al. | |
| 5,867,020 A | | 2/1999 | Moore et al. | |
| 5,877,861 A | | 3/1999 | Ausschnitt et al. | 356/401 |
| 5,894,350 A | | 4/1999 | Hsieh et al. | 356/399 |
| 6,079,256 A | | 6/2000 | Bareket | 73/105 |
| 6,143,621 A | | 11/2000 | Tzeng et al. | 438/401 |
| 6,239,587 B1 | * | 5/2001 | Buck | 324/95 |
| 6,259,525 B1 | | 7/2001 | David | 356/399 |
| 6,326,584 B1 | * | 12/2001 | Jewett et al. | 219/121.57 |
| 6,449,568 B1 | * | 9/2002 | Gerrish | 702/60 |
| 6,708,123 B2 | * | 3/2004 | Gerrish | 702/60 |
| 6,781,317 B1 | * | 8/2004 | Goodman | 315/111.21 |
| 2003/0052085 A1 | * | 3/2003 | Parsons | 216/60 |

(Continued)

FOREIGN PATENT DOCUMENTS

EP  1 339 086 A2  8/2003

OTHER PUBLICATIONS

Armitage Jr., J.D. and Kirk, J.P., "Analysis of overlay distortion patterns", *SPIE, 921*:207-222, (1988).

(Continued)

*Primary Examiner*—Carol S. W. Tsai
(74) *Attorney, Agent, or Firm*—Harness, Dickey & Pierce, P.L.C.

(57) ABSTRACT

A system for field substitution of components of a RF metrology system. The system includes a sensor/cable combination and an analysis unit. Parameters of the RF metrology system are determined prior to placing the RF metrology system in the field. From these parameters, either component, the cable/sensor combination or the analysis module, may be substituted in the field by recalibrating the system for the substituted unit. Such recalibration is carried out utilizing the parameters determined prior to placing the RF metrology system in the field.

20 Claims, 4 Drawing Sheets

U.S. PATENT DOCUMENTS

| | | | |
|---|---|---|---|
| 2004/0021454 A1 * | 2/2004 | Jevtic et al. | 324/72.5 |
| 2004/0150389 A1 * | 8/2004 | Anderson et al. | 324/158.1 |
| 2004/0210407 A1 * | 10/2004 | Quon et al. | 702/65 |
| 2004/0253921 A1 * | 12/2004 | Turner | 455/2.01 |

OTHER PUBLICATIONS

Bjorkholm et al., "Reduction imaging at 14 nm using multilayer-coated optics: printing of features smaller than 0.1 $\mu$m", *J. Vac. Sci. Technol.B., 8(6)*:1509-1543, (1990).

Brunner, T.A., "Impact Of Lens Aberrations On Optical Lithography", *IBM Journal of Research and Development: Optical Lithography 41(1-2)*:57-67, (1997)(http://www.research.ibm.com/journal/rd/411/brunner.html).

Bruning et al., "Optical Lithography—Thirty years and three orders of magnitude", *SPIE, 3051*:14-27, (1997).

Cote et al., "Micrascan™ III-performance of a third generation, catadioptric step and scan lithographic tool", *SPIE, 3051*:806-816, (1997).

DeJule, R., "Mix-and Match: A Necessary Choice", *Semiconductor International, 23(2)*: 66-76, (Feb., 2000).

Dooly, T. and Yang, Y., "Stepper matching for optimum line performance", *SPIE, 3051*:426-432, (1997).

Goodwin, F. and Pellegrini, J.C., "Characterizing Overlay Registration of Concentric 5X and 1X Stepper Exposure Fields using Interfield Data", *SPIE, 3050*:407-417, (1997).

*Handbook of Microlithography, Micromachining, and Microfabrication*, Book: vol. 1, "Microlithography", Rai-Choudhury, P. (Ed.), SPIE Optical Engineering Press, SPIE, Bellingham, Washington, pp. 417-418, (1997).

Hasan et al., "Automated Electrical measurements of Registration Errors in Step-and-Repeat optical Lithography Systems", *IEEE Transactions on Electron Devices, ED27 (12)*:2304-2312, (1980).

Kemp et al., "A "golden standard" wafer design for optical stepper characterization", *SPIE, 1464*:260-266, (1991).

KLA 5105, "Linewidth and Misregistration System", KLA 5105 Product Specifications, *KLA Instruments Corporation*, 2 pages, (1995).

KLA 5200, "Value-added Overlay Metrology for Advanced Lithography", KLA 5200 Product Specifications, *KLA Instruments Corporation*, 2 pages, (1996).

Kodama, K. and Matsubara, E., "Measuring system XY-5i", *SPIE, 2439*:144-155, (1995).

Leica LMS IPRO, "Fully automated mask and wafer metrology system", *Leica*, pamphlet pp. 1-5.

Lin, B.J., "The Attenuated Phase-Shifting Mask", *Solid State Technology*, Special Series/Advanced Lithography, 35(1):43-47, ( Jan., 1992).

MacMillen, D. and Ryden, W.D., "Analysis of image field placement deviations of a 5X microlithographic reduction lens", *SPIE, 334*:78-89, (1982).

Martin et al., "Measuring Fab Overlay Programs", *SPIE, 3677*:64-71(1999).

Mc Fadden, E.A. and Ausschnitt, C.P., "A Computer Aided Engineering Workstation For Registration Control", *SPIE, 1087*:255-266, (1989).

Mulkens et al., "ArF Step And Scan Exposure System For 0.15 $\mu$m Technology Node?", *SPIE, 3679*:506-521, (1999).

Newnam, B.E. and Viswanathan, V.K., "Development of XUV projection lithograph at 60-80 nm", *SPIE, 1671*:419-436, (1992).

*Numerical Recipes*, "The Art of Scientific Computing", Press et al. (Eds.), Cambridge University Press, New York, pp. 52-64 (1990).

Pellegrini, J.C., "Comparisons of Six Different Intrafield Control Paradigms in an Advanced Mix-and-Match Environment", *SPIE, 3050*:398-406, (1997).

Pellegrini et al., "Super Sparse Overlay Sampling Plans: An Evaluation of Methods and Algorithms for Optimizing Overlay Quality Control and Metrology Tool Throughput", *SPIE, 3677*:72-82, (1999).

Preil, M.E. and McCormack, J.F.M., "A New Approach to Correlating Overlay and Yield", *SPIE, 3677*:208-216, (1999).

Quaestor Q7, "Fully Automated Optical Metrology System for Advanced IC Production", Quaestor Q7 Product Specification, *BIO -RAD*, 2 pages.

Raugh, M.R., "Error estimation for lattice methods of stage self-calibration", *SPIE, 3050*:614-625, (1997).

Sullivan, N.T., "Semiconductor Pattern Overlay", *SPIE Critical Reviews of Optical Science and Technology, CR52*: 160-188, (1994).

Takac et al., "Self-calibration in two-dimensions: the experiment", *SPIE, 2725*:130-146, (1996).

van den Brink et al., "Direct-referencing automatic two-points reticle-to-wafer alignment using a projection column servo system", *SPIE, 633*:60-71, (1986).

van den Brink et al., "Matching Management Of Multiple Wafer Steppers Using A Stable Standard And A Matching Simulator", *SPIE, 1087*:218-232, (1989).

van den Brink et al., "Matching Of Multiple Wafer Steppers For 0.35 $\mu$m Lithography Using Advanced Optimization Schemes", *SPIE, 1926*:188-207, (1993).

van den brink et al., "Matching Performance For Multiple Wafer Steppers Using An Advanced Metrology Procedure", *SPIE, 921*:180-197, (1988).

van den Brink et al., "New 0.54 Aperture i-Line Wafer Stepper With Field By Field Leveling Combined With Global Alignment", *SPIE, 1463*:709-724, (1991).

van Schoot et al., "0.7 NA DUV Step & Scan System For 150nm Imaging With Improved Overlay", *SPIE, 3679*:448-463, (1999).

Yost, A. and Wu, W., "Lens matching and distortion testing in a multi-stepper, sub-micron environment", *SPIE, 1087*: 233-244, (1989).

Zavecz et al., "Life Beyond Mix-and-Match: Controlling Sub-0.18 $\mu$m Overlay Errors", *Semiconductor International, 23(8)*:205,206,208,210,212 and 214, (Jul., 2000).

Zavecz, T.E., "Machine Models and Registration", *SPIE Critical Reviews of Optical Science and Technology, CR52*: 134-159 (1994).

Advanced RF Metrology for Plasma Process Control, David Coumou, Oct. 2003.

* cited by examiner

RF METROLOGY CHARACTERIZATION FOR FIELD INSTALLATION AND SERVICEABILITY FOR THE PLASMA PROCESSING INDUSTRY

FIELD OF THE INVENTION

The present invention relates to measurement systems in general and, in particular, a radio frequency (RF) characterization system for facilitating field replacement of measurement system components.

BACKGROUND OF THE INVENTION

In a typical radio frequency (RF) plasma generator arrangement, a high power RF generator produces a RF wave at a preset frequency, such as 13.56 MHz, that is applied to a plasma chamber via a power conduit. Because an impedance mismatch typically exists between the RF power source and the plasma chamber, an impedance matching network is placed between the RF generator and the plasma chamber. Plasma chambers characteristically operate non-linearly which, in combination with line losses in the impedance matching network, results in less than all of the output power of the RF generator reaching the plasma chamber. A sensor functions as a combined voltage and current probe, referred to as a V/I probe, is typically placed in close proximity to the power input to the plasma chamber to detect the voltage and current of the RF wave as it enters the plasma chamber. Accurately measuring the voltage and current in close proximity to the chamber as possible provides an indication of the quality of the plasma process. This in turn yields better control of the etching or deposition characteristics for a silicon wafer or other workpiece in the chamber.

In order to obtain accurate measurements, the V/I probe is calibrated under predetermined and strictly controlled conditions. Calibration occurs at the place of manufacture or factory prior to being sent into the field for installation. In order to further assure accuracy, a sensor or V/I probe is bundled into a RF metrology system. The RF metrology system includes a sensor or V/I probe, a cable, and an analysis unit. This entire RF metrology system is calibrated at the factory prior to being sent into the field for installation and use. When RF metrology components in the field need repair or replacement, the entirety of the RF metrology system must be removed from the field installation. The metrology system is returned to the manufacturer or authorized repair facility, where one or more components of the RF metrology system are repaired or replaced. The repair facility then recalibrates the entire RF metrology system and returns the repaired RF metrology system to the field for reinstallation and use.

While the above process does enable reuse of the components of the RF metrology system, if any one portion of the RF metrology system needs repair, whether it be the sensor, the cable, or the analysis unit, the entirety of the system must be removed in the field. No present system enables the replacement or repair of a single component of the metrology system in the field. This can significantly increase the cost and delay of returning the metrology system to operation once it has been determined that anyone component of the metrology system requires repair.

In addition to repair issues, present systems to not provide for convenient upgrading of RF metrology components. Conventional RF metrology systems face similar issues with respect to upgrades as they do for repair or replacement. When it is desired to replace one or a number of components of the RF metrology system with different or improved components, present systems require that the entirety of the system be removed so that the replacement component can be installed and the system recalibrated. This adds to the cost of upgrading components of an RF metrology system and can adversely impact downtime of the plasma chamber. Further yet, it may at times be preferable to install a passive sensor component into a RF system and install an analysis module at a later time. Conventional RF systems, however, would require that the RF metrology components be removed and recalibrated in order to add the analysis component at a later time. This requires disturbing the RF path in order to calibrate which is generally undesirable.

SUMMARY OF THE INVENTION

A method and apparatus for enabling field substitution, replacement, upgrading, or later addition of individual components of an RF metrology system. The method includes calibrating a complete system prior to placing the system in the field. Following calibration of a complete system, the sensor which was calibrated as part of the complete system is then characterized. Next, the analysis module is characterized similarly to how the base sensor is characterized. A group of pool sensors which may be substituted into the base RF metrology system are then characterized. Calibration coefficients are then determined using characterization data for the analysis module and for the pool sensors. The calibration coefficients are then placed in a scaling matrix for use during substitution of a particular component.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
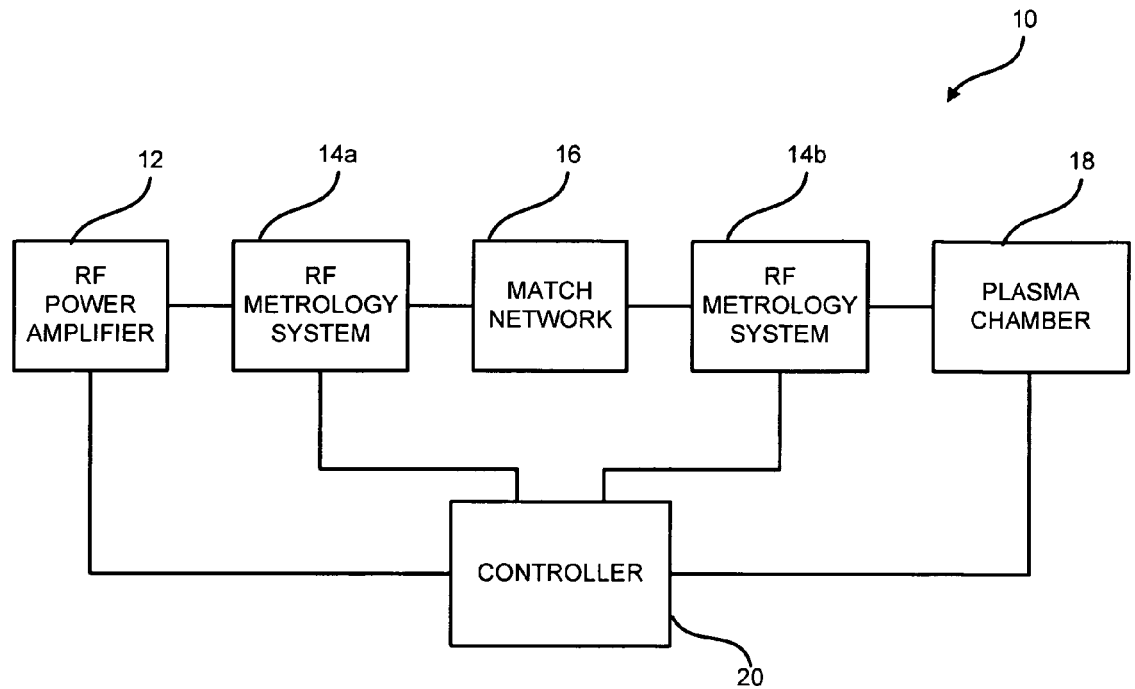
FIG. 1 is a block diagram of a plasma system.

FIG. 1 depicts a control system in which the RF metrology system of the present invention may be implemented for controlling a plasma chamber. Control system 10 includes a plasma chamber 18, such as may be used for fabricating integrated circuits. Plasma chamber 18 includes one or a plurality of gas inlets and one or a plurality of gas outlets (not shown). The gas inlets and outlets enable the introduction and evacuation of gas from the interior of plasma chamber 18. A controller 20 receives inputs from the plasma chamber, which may include a vacuum signal which indicates the level of vacuum in the chamber, a voltage signal, and a signal indicating the ratio of flows between the inlet and outlet gases. As one skilled in the art will recognize, other inputs/outputs may also be received/generated by controller 20. Controller 20 determines a desired input power to be applied to plasma chamber through a power supply or RF power amplifier 12. RF power amplifier 12 may optionally include a microprocessor, or other similar controller, which receives the applied signal from controller 20. RF power amplifier 12 outputs a RF signal which is input to a matching network 16 which matches impedances between RF power amplifier 12 and plasma chamber 18.

A first RF metrology system 14a is interposed between RF power amplifier 12 and match network 16. A second RF metrology system 14b is interposed between match network 16 and plasma chamber 18. RF metrology systems 14a, 14b measure voltage and current output by respective RF power amplifier 12 and match network 16. RF metrology systems 14a, 14b are selected and installed in accordance with particular design considerations. One or both of RF metrology systems may be used. For convenience RF metrology systems 14a, 14b will be referred to using only reference numeral 14 without letters. RF metrology system 14 provides feedback signals to controller 20. It will be recognized by one skilled in the art the FIG. 1 depicts a simplified block diagram of a control system 10 and that various feedback and control paths may be implemented in a control system. Such implementations depend upon particular design considerations.

Figure 2:
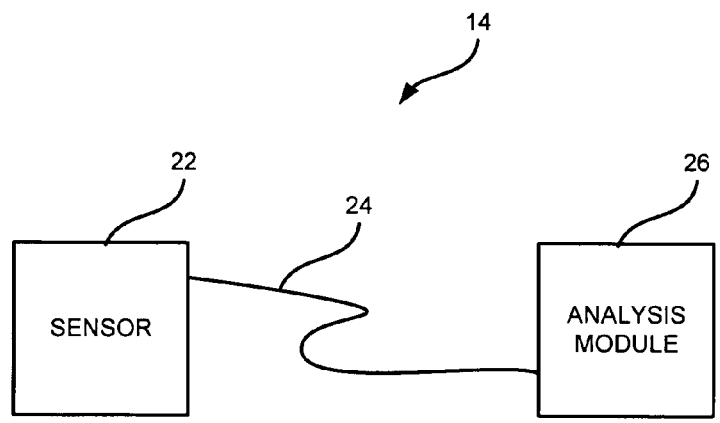
FIG. 2 is a block diagram of a metrology system arranged in accordance with the principles of the present invention.

RF metrology system 14 may be characterized generally as a passive RF sensor, an analysis module that processes the signals from the passive sensor, and an interconnect device for coupling the sensor and the analysis module. With reference to FIG. 2, an expanded view of RF metrology system 14 is shown. RF metrology system 14 includes a sensor 22, typically configured as a V/I probe. Sensor 22 connects to an interconnect device or cable 24, which in turn connects to an analysis module 26. Interconnect device or cable 24 may be any device which couples the signals output by sensor 22 to analysis module 26. With respect to the present invention, although sensor 22 and cable 24 are shown and described as separate elements, sensor 22 and cable 24 may be considered as a single unit. When a sensor is replaced, an associated cable is also replaced. The RF metrology system 14 of FIG. 2 can be viewed as having two components, a sensor/cable component and an analysis module component. For the purpose of this description, the sensor/cable combination will simply be referred to as sensor 22, but may optionally include cable 24.

The RF metrology system 14 of the present invention enables replacement of one of the sensor 22 or the analysis module 26 in the field. The term replacement as used herein shall refer to any one of upgrading, substituting improved or different, replacing, or adding at a later date either of the respective components in a RF metrology system. More specifically, one of the above two components may be replaced, without removing the entirety of the RF metrology system 14, returning the RF metrology system 14 to a repair facility for repair and calibration, and returning the RF metrology system 14 to the field for reinstallation and operation. In order to accomplish this, the present invention utilizes a frequency response measurement to characterize the sensor 22 and derives the response of the analysis module 26. More specifically, the frequency response is measured for each port of sensor 22 for a sequence of known loads and predetermined measurements to determine the parameters associated with the device.

Figure 3:
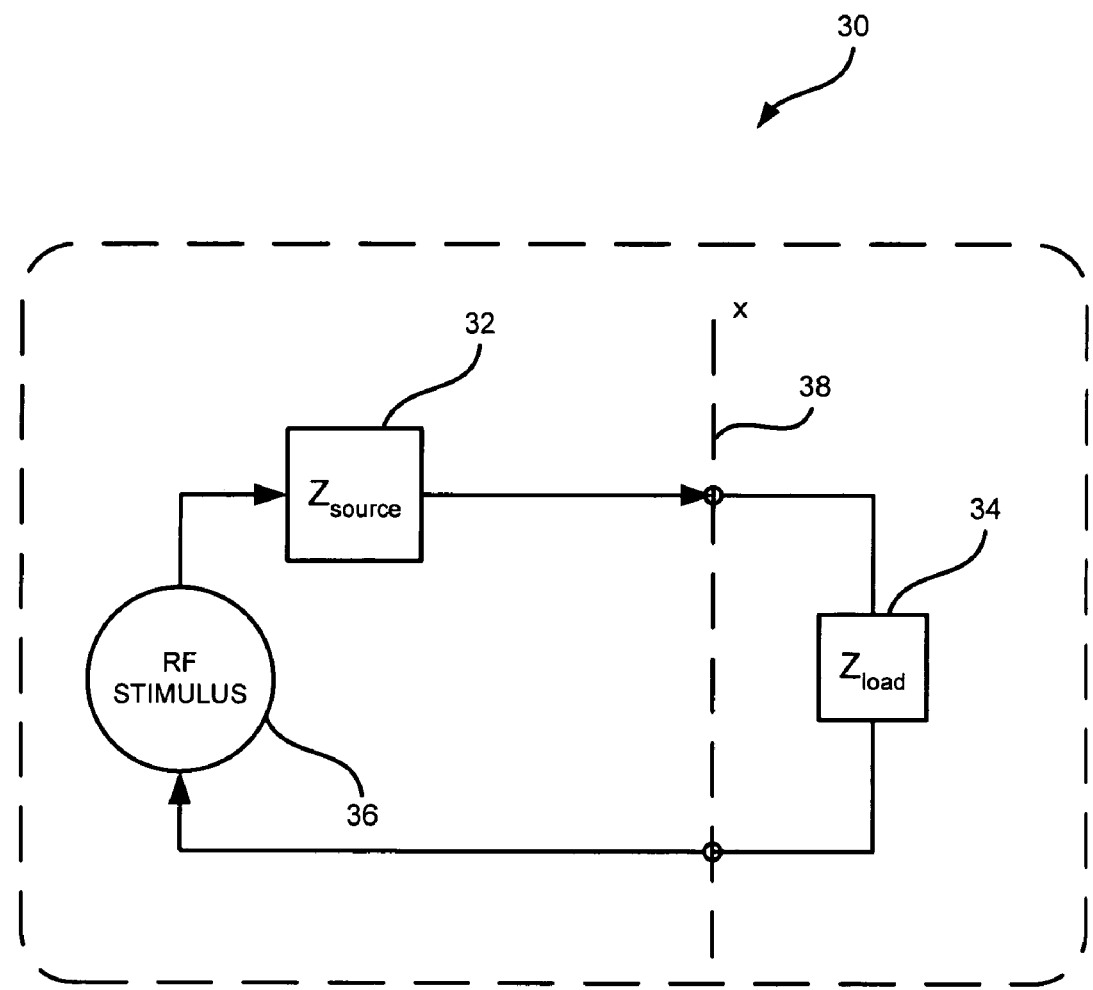
FIG. 3 is a block diagram of a system for characterizing a transmission line.

With reference to FIG. 3, FIG. 3 depicts a block diagram of a simplified transmission line system 30. Transmission line system 30 includes a load impedance 34 which represents the impedance of a given load. Transmission line system 30 also includes a source impedance 32 which represents the impedance of a source of RF energy applied to the load. A RF stimulus 36 is applied to the source impedance 32, causing a resultant output from source impedance 32 which is applied to load impedance 34. A plane 38, referred to as the calibration plane, is defined as a predetermined distance from the output of the source impedance 32. The calibration plane 38 defines a known reference position at which measurements characterizing the transmission line system 30 may be taken. The position of the calibration plane 38 is referred to as position x.

As is well known to those skilled in the art, transmission line system 30 maybe characterized in accordance with the following equations. The voltage at position x, V(x), may be defined in accordance with equation (1):

$$V(x) = I_L [Z_L \cosh(\gamma x) + Z_0 \sinh(\gamma x)] \quad (1)$$

where
$I_L$—the load current at position x;
$Z_L$—the impedance at position x;
$Z_0$—the characteristic impedance or the propagation constant.

The current at position x, I(x), may be defined in accordance with equation (2):

$$I(x) = (I_L/Z_0)[Z_L \cosh(\gamma x) + Z_0 \sinh(\gamma x)] \quad (2)$$

Two other values which are relevant in characterizing transmission line system 30 are the short-circuit impedance $Z_{sc}$ and the open circuit impedance $Z_{oc}$, which are defined below in accordance with respective equations (3) and (4):

$$Z_{sc} = Z_0 \tanh(\gamma x) \quad (3)$$

$$Z_{oc} = Z_0 \coth(\gamma x) \quad (4)$$

From these equations, the following equations may be derived for an RF metrology system including a sensor 22, a cable 24, and an analysis module 26. A calibration vector c(f) may be defined as a function of frequency in accordance with equation (5):

$$c(f) = K(f) * P(f) * x(f) \quad (5)$$

where
c(f)—calibration vector [Vc(f) Ic(f)], with Vc(f) being a voltage calibration coefficient for selected open circuit and short circuit conditions and Ic(f) being a current calibration coefficient;
K(f)—a standards matrix defining voltages and impedances at position x;
P(f)—a matrix defining the response of the RF metrology system to known impedances;
x(f)—a vector [Vv Vi] defining the raw voltage (Vv) and current (Vi) measured by the analysis module during the calibration process when the K(f) matrix is applied.

The calibration vector c(f) is used to generate a matrix that defines the calibration of the system. This matrix is defined as a scaling matrix. The scaling matrix represents the function of the calibrated system in accordance with equation (6):

$$P(f)*x(f)=S\sim(f)*Y(f)*a(f) \quad (6)$$

where x(f)—the matrix as defined above;
P(f)—the matrix as defined above;
S~(f)—sensor characterization matrix for open and short circuits;
Y(f)—sensor characterization matrix containing raw voltage data output by the sensor;
a(f)—vector defining the frequency response of the analysis module.

From equation (6), it can be seen that the product of $S\sim(f)*Y(f)*a(f)$ represents the function of the calibrated system $P(f)*x(f)$. This equation is formed from the product of three unknown variables $P(f)*x(f)$, $S\sim(f)*Y(f)$, and a(f). $P(f)*x(f)$ is determined utilizing the traditional calibration scheme, as will be described in greater detail. That is, this product is determined typically at the time and place of manufacture, rather than in the field. $S\sim(f)*Y(f)$ can be determined using a method for characterizing the response of sensor 22. Because all of these variables are frequency dependent, the process of deconvolution is used to determine a(f), which is the remaining unknown. That is, a(f) is defined in accordance with equation (7):

$$a(f)=S\sim^{-1}(f)*Y^{-1}(f)*P(f)*x(f) \quad (7)$$

Setting $S(f)=S\sim(f)*Y(f)$, equation (7) can be simplified as defined in accordance with equation (8):

$$a(f)=S^{-1}(f)*P(f)*x(f) \quad (8)$$

The above equations are described in greater detail in U.S. Pat. No. 6,449,568, issued Sep. 10, 2002 and assigned to the assignee of the present invention, the disclosure of which is incorporated by reference.

Figure 4:
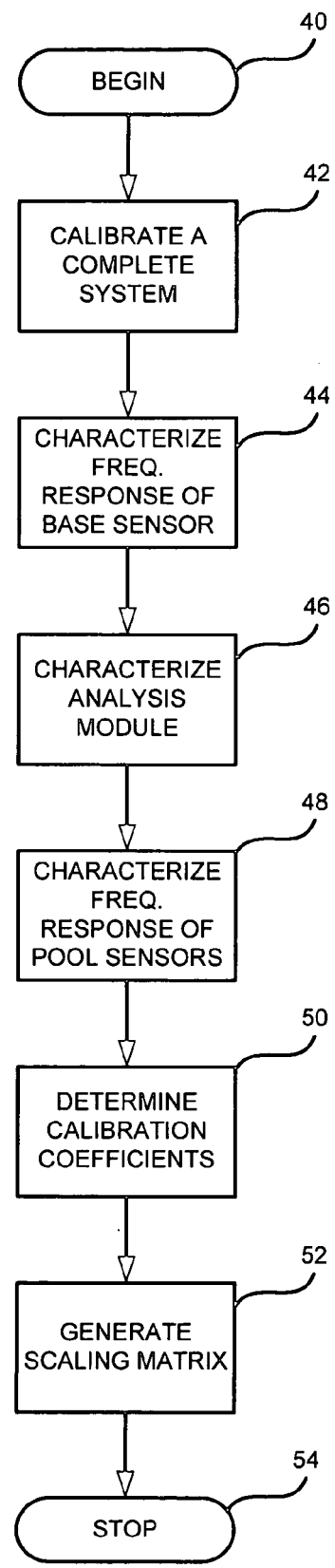
FIG. 4 is a flowchart of the steps for characterizing the RF metrology system.
Figure 5:
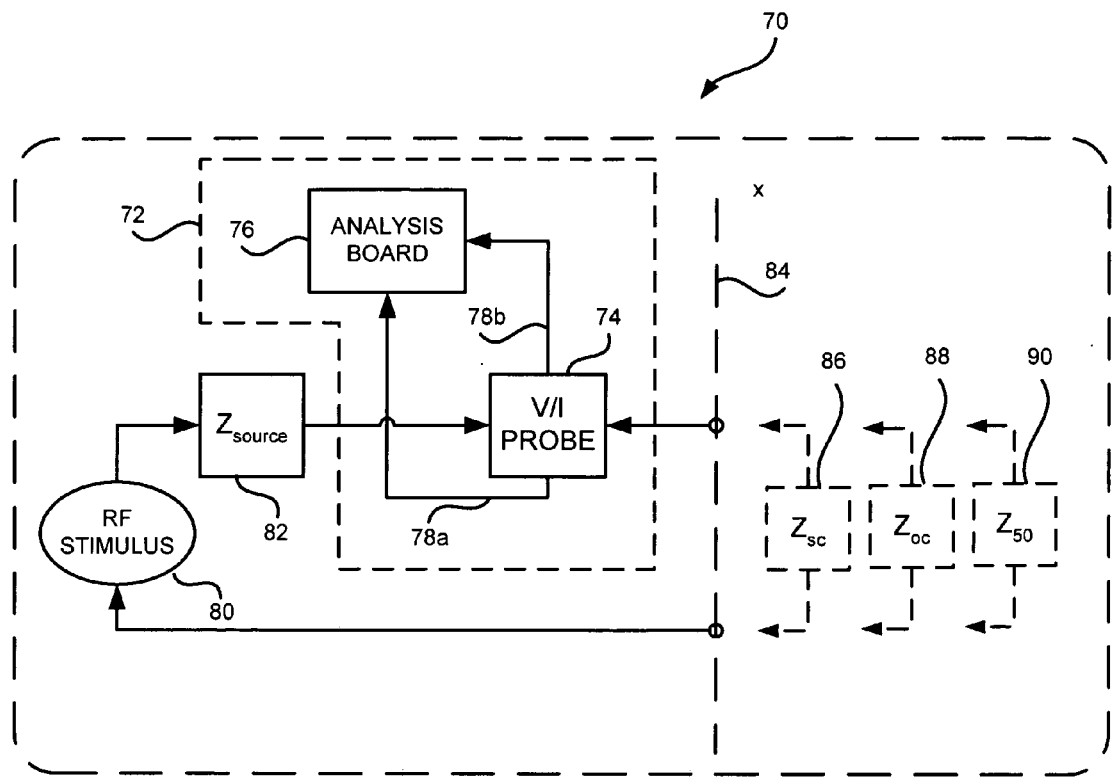
FIG. 5 is a block diagram depicting the components for characterizing a RF metrology system in accordance with the present invention.

FIG. 4 is a flow diagram for implementing the method of RF metrology characterization. The process begins at start block 40 and proceeds to block 42. At block 42, a complete metrology system is calibrated, such as is conventionally done in the factory prior to shipping the RF metrology system. FIG. 5 depicts a block diagram of a calibration system 70 for implementing step 42 of FIG. 4. Calibration system 70 implements a factory calibration process in preparation for determining values defined above with respect to equations (5) through (8). Calibration system 70 includes a RF metrology system 72, such as described above with respect to FIGS. 1 and 2. RF metrology system 72 includes a V/I probe 74, an analysis module 76, and a pair of cables 78a, 78b. Cables 78a, 78b interconnect V/I probe 74 to analysis module 76. One of cables 78a, 78b interconnects V/I probe 74 to analysis module 76 to provide current information output by V/I probe 74 to analysis module 76. The other of cables 78a, 78b interconnects V/I probe 74 to analysis module 76 and provides current information. In combination, cables 78a and 78b provide both voltage and current information from V/I probe 74 to analysis module 76.

RF stimulus module 80 generates an output signal to a source impedance 82. RF stimulus module 80 may be implemented as a broadband amplifier controlled by a high fidelity signal generator. In response to the RF stimulus, 36 RF signals are applied to v/I probe 74. V/I probe 74 receives the RF signal output by RF stimulus 36 and provides both voltage and current information on cables 78a, 78b to analysis module 76. Calibration system 70 sequentially inserts one of three load impedances into the circuit of calibration system 70. The loads inserted into the circuit are a short-circuit impedance 86, an open circuit impedance 88, and a 50 ohm impedance 90.

Once step 42 is completed, the values for matrix P(f) and vector x(f) will have been generated. The values will be referred to in shorthand notation as $P_m$ and $x_m$, where m defines a particular calibrated metrology system. A calibration plane 84 defines a position x at which measurements for equations (5) through (8) may be taken.

Once the complete system is calibrated, control proceeds to block 44 in which the response of the sensor used in step 42 is characterized. This sensor will be referred to as a base sensor because it was calibrated as part of a complete system calibration. In order to carry out step 44, a sensor characterization circuit 100 of FIG. 6 generates signal and captures the responses to the signals. Sensor characterization circuit 100 includes a network analyzer 102 that generates control signals to a broadband amplifier 104. In one configuration, broadband amplifier 104 delivers 100 Watts to provide a suitable signal-to-noise ratio to provide a high fidelity measurement of the sensor. Amplifier 104 outputs an RF signal to directional coupler 106. In one configuration, directional coupler 106 is selected for its high directivity. A directivity of at least 50 decibels (dB) is considered sufficient. Directional coupler 106 in turn generates a signal which is applied to sensor 108. Sensor 108 of sensor characterization circuit 100 is the same sensor referred to with respect to step 42 and discussed in FIG. 5. That is, the sensor is the V/I probe 74 of FIG. 5. Sensor 108 passes the RF signal from directional coupler 106 onto the load 110. Load 110 includes three impedance loads: (1) a short circuit impedance; (2) an open circuit impedance, (3) and a 50 ohm impedance. Each impedance is inserted sequentially into the circuit.

In addition to providing input signal to amplifier 104, network analyzer 102 measures several signals. In particular, directional coupler or 106 includes a forward port and a reverse port. Each port is connected to respective measurement ports of network analyzer 102. Similarly, the calibration plane (not shown) of the network analyzer 102 is established at the output of sensor 108. Network analyzer 102 is configured and calibrated for measuring the response of the sensor 108. Accordingly, network analyzer 102 measures the magnitude and phase response of sensor 108. Signals input to network analyzer 102 pass through an attenuator 112, which optimizes the signal-to-noise ratio. An attenuation of 23 dB is considered sufficient. Three loads are inserted into the circuit, and network analyzer 102 collects data sets for each configuration. The circuit of FIG. 100 is used to collect six data sets. These data sets include (1) open circuit load data for the voltage port; (2) short circuit load data for the voltage port; (3) 50 ohm load data for the voltage port; include (4) open circuit load data for the current port; (5) short circuit load data for the current port; and (6) 50 ohm load data for the current port.

Figure 6:
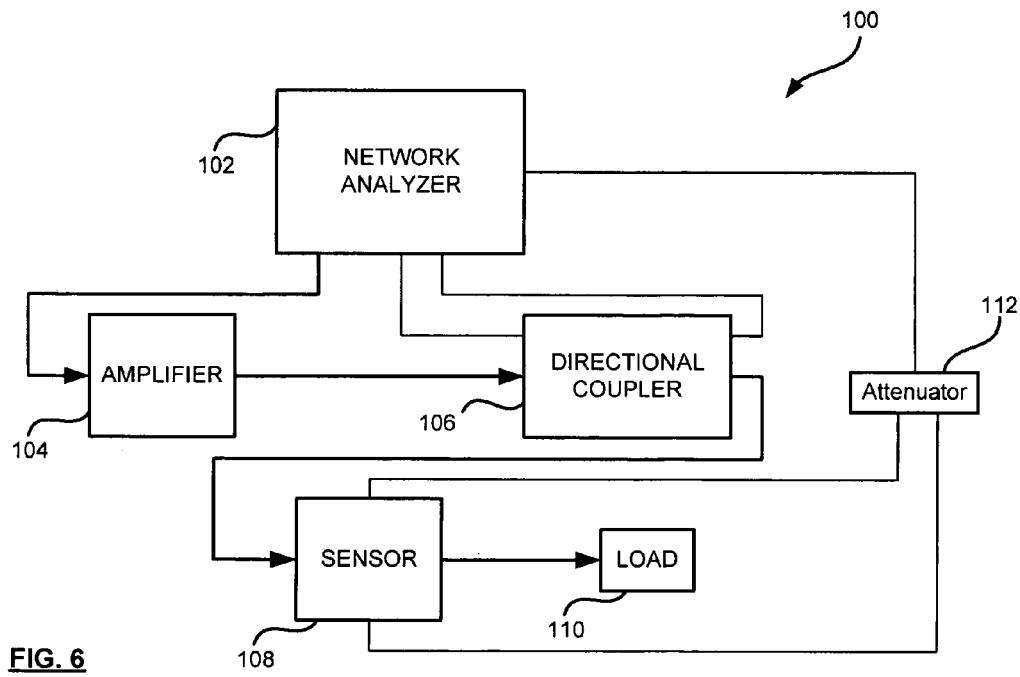
FIG. 6 is a block diagram of a system for characterizing the RF sensor.

Once the data has been collected as described with respect to FIG. 6, equations (5) through (8) enable the determination of the terms $S\sim_m$ and $Y_m$. Following determination of the terms $S\sim_m$ and $Y_m$, control proceeds to block 46 in which the analysis module is characterized in accordance with the data obtained at blocks 42 and 44. In particular, the analysis module m may be characterized in accordance with $a_m(f)$ using equation (8).

Control then proceeds to block 48 in which all sensors which may be substituted into the system characterized at block 42. The sensors that may be substituted will be referred to as pool sensors. A group of sensors must be characterized in anticipation that they may be used in the RF metrology system calibrated at block 42. Any such pool sensor must be characterized as described above with respect to block 44 and characterization circuit 100. Characterization of a pool sensor yields the terms $S\sim_I(f)$ and $Y_I(f)$, where I is an index value for a particular sensor in the pool of sensors. The pool sensors may be characterized by recalling equation (6) and substituting the known terms, $P_i(f)*x_i(f)=S\sim_I(f)*Y_I(f)*a_m(f)$, where i represents any system that has been calibrated as defined at block 42.

Control then proceeds to block 50 in which the calibration coefficients [Vc Ic] are determined for an interchangeable system. Calibration coefficients are determined from data determined at block 46 for an arbitrary analysis module and the data obtained at block 48 for an arbitrary sensor. The calibration coefficients are determined by again recalling equation (6) and substituting the known terms, $P_i(f)*x_i(f)=S\sim_I(f)*Y_I(f)*a_m$, where i represents any system that has been calibrated as defined at block 42. The calibration coefficients are defined as $c_i=K(f)*P_i(f)*x_i(f)$.

Control then proceeds to block 52 in which the calibration coefficients are placed into a scaling matrix. The scaling matrix is formed from the product of $S\sim_I(f)*A_0$, where $A_0(f)=S_I(f)*P_m(f)$, and the multiplication of the first row by $c_i(1)$ and the second row by $c_i(2)$.

Once the steps of FIG. 4 have been carried out, the characterization values obtained will allow for replacing individual components of an RF metrology system in the field rather than requiring removal and recalibration in a calibration facility. Such replacement occurs through the use of the above determined values. This will facilitate substitution, replacement, repair, upgrade, stepped installation, and the like of individual components of an RF metrology system.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A radio frequency (RF) metrology system for monitoring output of an RF generator to a load comprising:
   a sensor, the sensor sensing at least one of a voltage or current applied to a load;
   an analysis module, the analysis module receiving at least one of a voltage sensor signal or current sensor signal from the sensor;
   wherein at least one of the sensor or the analysis module is replaceable while the other of the sensor or analysis module remains installed and wherein the RF metrology system is recalibrated following replacement of the other of the sensor or analysis module.

2. The RF metrology system of claim 1 wherein the sensor further comprises a sensor module and a cable, the cable interconnecting the sensor module with the analysis module.

3. The RF metrology system of claim 1 further comprising a scaling matrix input to the analysis module in order to calibrate the RF metrology system following installation of the one replaced sensor or analysis module.

4. A method for replacing components of an RF metrology system for monitoring output of an RF generator to a load comprising the steps of:
   providing a RF system including a base sensor and a base analysis module;
   calibrating a base RF metrology system;
   determining a frequency response characteristic of the base sensor;
   determining a response characteristic of the base analysis module;
   characterizing a frequency response of a group of sensors other than the base sensor;
   determining a set of calibration coefficients in accordance with at least one of the response characteristic or the frequency response; and
   generating a scaling matrix in accordance with the calibration coefficients.

5. The method of claim 4 further comprising this step of replacing one of the base sensor and the base analysis module with one of a pool sensor and a pool analysis module to define a substitute RF metrology system.

6. The method of claim 5 further comprising this step of applying the scaling matrix to substitute RF metrology system in order to calibrate the substitute RF metrology system.

7. The method of claim 4 wherein the step of calibrating a complete system further comprises the steps of:
   providing a source of RF power for application of an RF signal to load;
   utilizing the RF metrology system for measuring application of the RF signal to the load.

8. The method of claim 7 wherein the load comprises a plurality of impedances.

9. The method of claim 8 wherein he impedances include a plurality of a short circuit impedance, an open circuit impedance, and a 50 ohm impedance.

10. The method of claim 4 further comprising the step of characterizing a frequency response of the base sensor.

11. The method of claim 10 further comprising the step of characterizing the analysis module.

12. The method of claim 11 further comprising providing a pool of sensors, each sensor of which is characterized for operation with the RF metrology system.

13. The method of claim 12 further comprising the step of determining a set of calibration coefficients for the RF metrology system.

14. The method of claim 13 further comprising the step of generating a scaling matrix to define the RF metrology system.

15. A method for replacing components of an RF metrology system for monitoring output of an RF generator to a load comprising the steps of:
   providing a RF system including a base sensor and a base analysis module;
   calibrating a base RF metrology system;
   determining a frequency response characteristic of the base sensor;
   determining a response characteristic of the base analysis module;
   characterizing a frequency response of a group of sensors other than the base sensor; and
   determining a set of calibration coefficients in accordance with at least one of the response characteristic or the frequency response.

16. The method of claim 15 further comprising the step of generating a scaling matrix in accordance with the calibration coefficients.

17. The method of claim 15 further comprising this step of replacing one of the base sensor and the base analysis module with one of a pool sensor and a pool analysis module to define a substitute RF metrology system.

18. The method of claim 17 further comprising this step of applying the scaling matrix to substitute RF metrology system in order to calibrate the substitute RF metrology system.

19. The method of claim 15 wherein the step of calibrating a complete system further comprises the steps of:

provided a source of RF power for application of an RF signal to load;

utilizing the RF metrology system for measuring application of the RF signal to the load.

20. The method of claim 19 wherein the load comprises a plurality of impedances.

* * * * *

UNITED STATES PATENT AND TRADEMARK OFFICE
CERTIFICATE OF CORRECTION

PATENT NO. : 6,983,215 B2
DATED : January 3, 2006
INVENTOR(S) : Coumou et al.

It is certified that error appears in the above-identified patent and that said Letters Patent is hereby corrected as shown below:

Column 1,
Line 62, "anyone" should be -- any one --.

Column 3,
Line 31, after "art", "the" should be -- that --.

Column 4,
Line 23, "maybe" should be -- may be --.

Column 5,
Line 66, "v/I" should be -- V/I --.

Column 6,
Line 64, "$_{am}(f)$" should be -- $a_m(f)$ --.
Line 67, after "system" insert -- are --.

Column 8,
Line 34, "he" should be -- the --.

Signed and Sealed this

Eighteenth Day of April, 2006

JON W. DUDAS
*Director of the United States Patent and Trademark Office*